United States Patent [19]

Isshiki et al.

[11] Patent Number: 4,685,753
[45] Date of Patent: Aug. 11, 1987

[54] INTERCONNECTION APPARATUS FOR WIRING HARNESSES

[75] Inventors: Isao Isshiki, Nara; Hitoshi Hayashi, Suzuka, both of Japan

[73] Assignee: Tokai Electric Wire Company Limited, Japan

[21] Appl. No.: 843,850

[22] Filed: Mar. 26, 1986

Related U.S. Application Data

[63] Continuation of Ser. No. 626,630, Jul. 2, 1984, abandoned.

[30] Foreign Application Priority Data

Jul. 5, 1983 [JP] Japan .................. 58-122640

[51] Int. Cl.$^4$ .............................................. H01R 9/09
[52] U.S. Cl. ........................................ 439/74; 439/62; 439/78
[58] Field of Search .......... 339/17 M, 17 LM, 17 LC, 339/17 R; 361/395, 399, 412, 415

[56] References Cited

U.S. PATENT DOCUMENTS

| | | | |
|---|---|---|---|
| 3,667,045 | 5/1972 | Combs | 339/17 M |
| 3,917,984 | 11/1975 | Kong et al. | 339/17 CF |
| 3,963,301 | 6/1976 | Stark | 339/186 M |
| 4,133,592 | 1/1979 | Cobaugh et al. | 339/17 M |
| 4,135,226 | 1/1979 | Kourimsky | 339/17 LM |
| 4,218,724 | 8/1980 | Kaufman | 339/17 M |
| 4,514,784 | 4/1985 | Williams | 339/17 M |

FOREIGN PATENT DOCUMENTS

| | | | |
|---|---|---|---|
| 1076766 | 3/1960 | Fed. Rep. of Germany | 361/415 |
| 1615596 | 4/1970 | Fed. Rep. of Germany | . |
| 664321 | 5/1979 | U.S.S.R. | 339/17 M |

OTHER PUBLICATIONS

IBM Bulletin, Wyma et al., vol. 2, No. 1, p. 10, 7-1959.

*Primary Examiner*—Neil Abrams
*Attorney, Agent, or Firm*—Harness, Dickey & Pierce

[57] ABSTRACT

An apparatus for interconnecting functional component circuits and branch circuits of a wiring harness. A wiring board includes a plurality of tab contact members and mounted on one surface of the wiring board is a first printed-circuit board including a plurality of control element components forming functional component circuits. Also mounted on the other surface of the wiring board is a second printed-circuit board which includes the functional element components of the components forming the functional component circuits.

10 Claims, 4 Drawing Figures

INTERCONNECTION APPARATUS FOR WIRING HARNESSES

This application is a continuation of application Ser. No. 626,630, filed July 2, 1984, now abandoned.

BACKGROUND OF THE INVENTION

The present invention relates to improvements in and relating to an interconnection apparatus for wiring harnesses in which a busbar is arranged to form a large number of branch conductive paths and the electric cables of a wiring harness are connected to the branch conductive paths thereby providing a large number of branch circuits.

With a conventional wiring harness used for wiring the body of an automobile, it is necessary to provide a large number of branch circuits in the midst of the wiring harness and an interconnection apparatus for wiring harnesses (hereinafter simply referred to as an interconnection apparatus) is known in which a plurality of branch conductive paths corresponding to the previously mentioned wiring harness branch circuits are integrally formed on an electric wiring board by the arrangement of a busbar and the cables of a wiring harness are connected to the branch conductive paths thereby concentrically providing the desired branch circuits.

On the other hand, in order to ensure the functioning of the branch circuits, the wiring harness is required to arrange the required elements for the branch circuits, e.g., groups of functional components such as relays, diodes, capacitors and timers and incorporate these circuits in the branch circuits.

Thus, arrangements are in use in which these functional components are concentrated and accommodated in a casing for each branch circuit and the casings are mounted on an interconnection apparatus thereby incorporating them in the midst of the branch conductive paths or alternatively in the case of a time control unit, a power window timer and a power window control, for example, the required functional component groups are separately grouped and mounted scatteringly on the vehicle body thereby connecting them to the interconnection apparatus through the wiring harness.

With the recent sophiscation of automobiles, however, the number of branch circuits of a wiring harness is increased and also there is a remarkable tendency toward incorporating a very great number of functional components in each branch circuit thus giving rise to a need for making smaller and more compact the whole construction of a wiring harness system including an interconnection apparatus.

SUMMARY OF THE INVENTION

The present invention has been made in view of the foregoing technical trends and it is an object of this invention to provide a novel interconnection apparatus for constructing a wiring harness system which is compact and meets the requirements of sophisticated automobiles.

DESCRIPTION OF THE PREFERRED EMBODIMENT

The present invention will now be described in a greater detail with reference to the illustrated embodiment.

Figure 1:
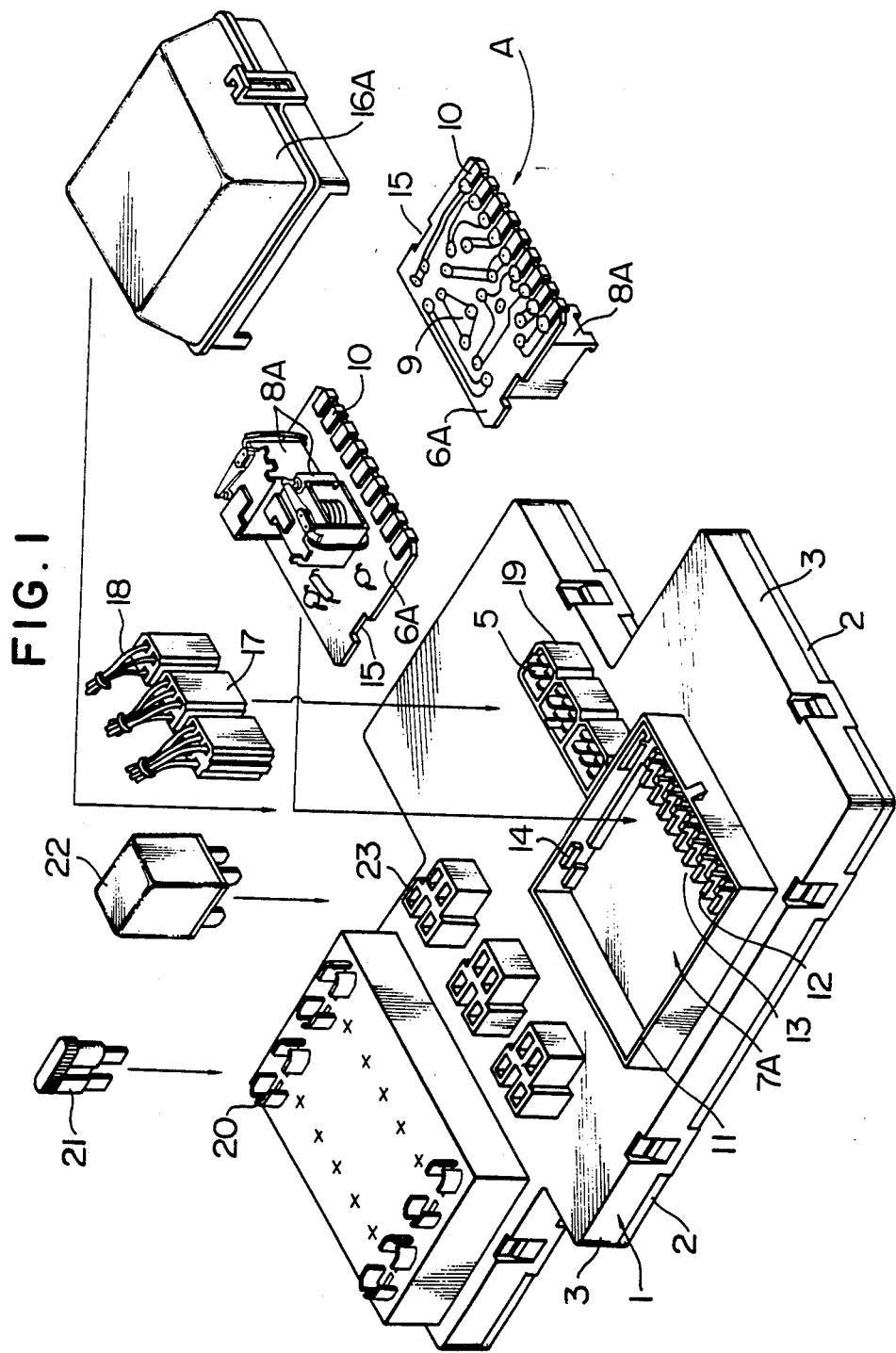
FIG. 1 is a perspective view showing a top section of an interconnection apparatus according to an embodiment of the invention.
Figure 2:
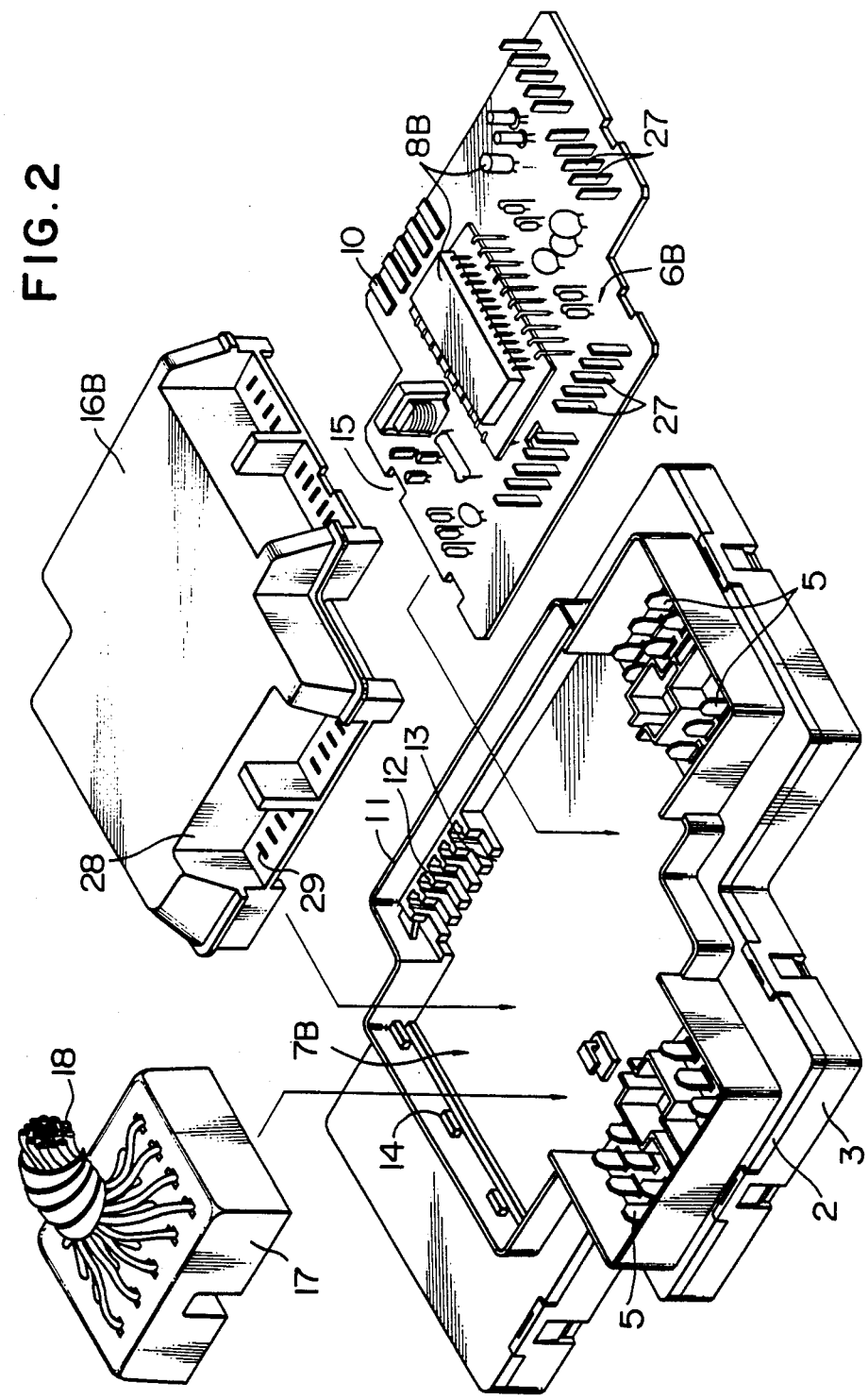
FIG. 2 is a perspective view showing the back section of the embodiment shown in FIG. 1.
Figure 3:
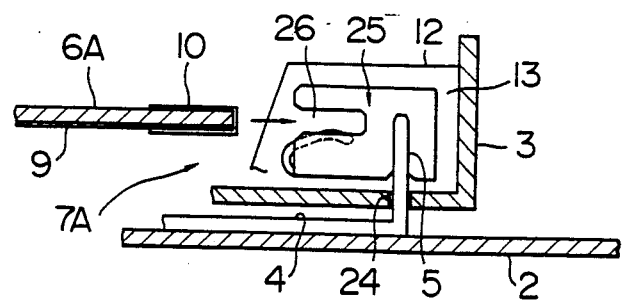
FIG. 3 is a front view showing the connection between a conductive path of a printed-circuit board and a busbar in the embodiment of FIG. 1.

Referring to FIGS. 1 to 4 showing the embodiment, an interconnection apparatus 1 of this invention includes a plate wiring board 2 of insulating material and an upper case 3 which are combined as a unit and a known busbar is arranged on the wiring board 2 to concentrically form the required branch circuits for a wiring harness and the ends of the busbar are provided with tab contact members 5 (partly shown) vertically arranged on the wiring board 2 to project through the upper case 3 or project downwardly of the wiring board 2 for connection with the conductive paths of printed-circuit boards which will be described later or a connector 17 at the end of a bunch of cables 18 of the wiring harness. Also, formed on the upper surface of the upper case 3 is a reception chamber 7A for receiving a printed-circuit board 6A and the reception chamber 7A has a bottomed square shape enclosed by a frame member 11 for receiving the printed-circuit board 6A from above with terminal receiving pockets 13 defined by partition walls 12 being arranged parallely on the front bottom portion. On the other hand, of the functional components of the wiring harness only a group of working elements 8A such as relays forming working means are densely arranged concentrically and in a stratified manner on the upper surface of the printed-circuit board 6A. Also, conductive paths 9 for the working elements 8A are formed by printed wiring on the back surface of the printed-circuit board 6A as shown at A in FIG. 1 and flat sheet terminals 10 are grippingly attached side by side to the edge portion of one side edge of the printed-circuit board 6A so as to be electrically connected to the conductive paths 9. Then, the terminals 10 and the busbar end are interconnected in the following manner. More specifically, referring to FIG. 3, one of the tab contact members 5 at the end portion of the busbar 4 is projected through each tab inserting hole 24 of the upper case 3 and an intermediate terminal 25 is fitted on the tab contact member 5. Then, it is designed so that when the printed-circuit board 6A is inserted from above into the reception chamber 7A as shown in FIG. 1 and then slightly slided forwardly, the terminals 10 arranged side by side at the side edge of the printed-circuit board 6A are each engaged with a slot contact portion 26 of the intermediate terminal 25 in one of the pockets 13 as shown in FIG. 3 so that the conductive paths 9 of the printed-circuit board 6A are connected to the busbar 4 and the functional component circuits of the operating element group 8A are incorporated in the branch circuits of the busbar 4. It is to be noted that the insertion of the printed-circuit board 6A is allowed by the engagement of a pair of notches 15 formed at its opposed side edges with a pair of engaging projections 14 on the side edges of the reception chamber 7A and then the printed-circuit board 6A is held in place by the pair of engaging projections 14 thereby detachably holding it in place.

Also, fuse mounts 20 for the respective branch circuits are concentrically provided on the upper surface of the upper case 3 and a two-leg fuse 21 is fitted in each of the fuse mounts 20. In addition, there are provided connector mounts 19 each including the vertically arranged tab contact members 5 and connectors 17 at the end of bunches of cables 18 are received in the connector mounts 19 thereby connecting the branch circuits provided by the busbar 4 to the wiring harness. In FIG. 1, numeral 16A designates a cover for the reception chamber 7A which, after the insertion of the printed-circuit board 6A, is placed over the working element group 8A to cover and protect them. In the Figure, numeral 22 designates a housing containing an externally fitted relay which must be replaced periodically and 23 mounts for the former.

Referring now to FIG. 2, a reception chamber 7B enclosed by a frame member 11 is formed on the back surface of the wiring board 2 and it is constructed such that of the required functional components of the wiring harness only a group of control elemeents 8B such as a controller, timer, etc., forming a control unit are densely and concentrically arranged on a printed-circuit board 6B by for example the technique of automatic electronic component packaging system and this printed-circuit board 6B is received so as to connect the conductive paths of the printed-circuit board 6B to the tab contact members 5 at the ends of the busbar 4 and incorporate the conductive paths of the control element group 8B in the branch circuits of the busbar 4. As a result, the reception chamber 7B and the printed-circuit board 6B are respectively the same in construction with the reception chamber 7A and the printed-circuit board 6A, that is, the reception chamber 7B is provided at its one side edge with a plurality of receiving pockets 13 defined side by side by partition walls 12 to receive intermediate terminals 25 and the printed-circuit board 6B is provided with the similar conductive paths as the printed-circuit board 6A on its back surface and terminals 10 arranged side by side at its one side edge with the conductive paths being connected to the busbar 4 by the same connection arrangement as shown in FIG. 3.

Figure 4:
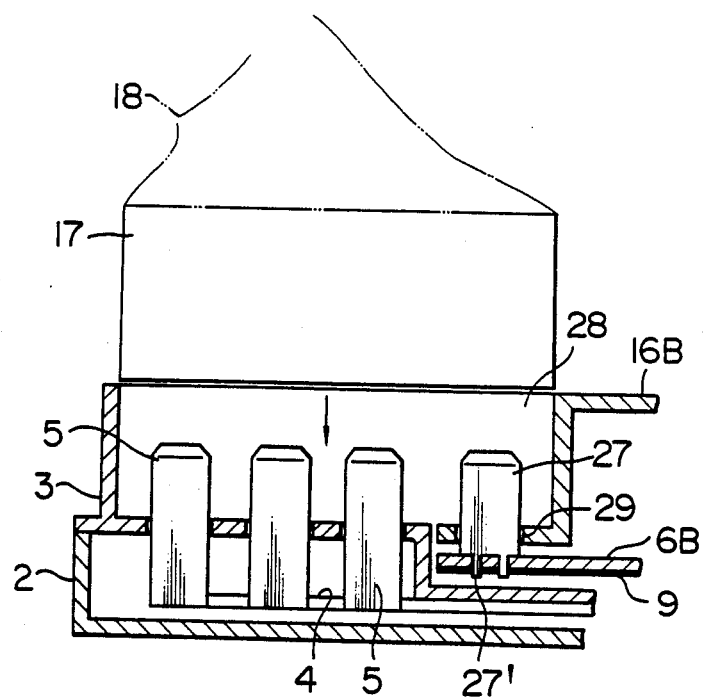
FIG. 4 is a front view showing a connecting mechanism in the embodiment of FIG. 2.

Referring further to FIGS. 2 and 4, the printed-circuit board 6B is provided at its another side edges with vertically mounted tab terminals 27 for connection with the conductive paths 9 on the back surface, and the tab contact members 5 at the ends of the busbar 4 are vertically arranged at the portions of the wiring board 2 which are adjacent to the side edges of the reception chamber 7B. Also, connecting mechanisms are provided so that when the printed-circuit board 6B is inserted in the reception chamber 7B, the tab contact members 5 and the tab terminals 27 are gathered together into groups and a connecter 17 at the end of a bunch of cables 18 is mounted as the common connector. More specifically, the printed-circuit board 6B is provided at the side edges with the tab terminals 27 vertically arranged side by side and each including a small leg piece 27' extending through the back surface and the small leg pieces 27' are soldered to the conductive paths 9. Also, a cover 16B for covering the printed-circuit board 6B is formed with recesses 28 at its side edges and holes 29 for receiving the tab terminals 27 are formed through the bottom of the recesses 28. Thus, when the printed-circuit board 6B is inserted into the reception chamber 7B and then the cover 16B is placed over the former, the tab terminals 27 project through the holes 29 and gather together with the tab contact members 5 projecting from the wiring board 2 into groups and the connector 17 at the end of the brunch of wiring harness cables 18 is inserted as the common connector thereby directly connecting the functional component circuits of the pritned-circuit board 6B to the wiring harness through the connector 17 and not through the busbar 4 of the wiring board 2.

In accordance with the above-described interconnection apparatus of the present invention, functional component groups to be incorporated in the branch circuits of a wiring harness are concentrically arranged on the printed-circuit boards of the interconnection apparatus in such a manner that the functional component groups are divided in a stratified manner into two classes, i.e., a control element group and a working element group which are gathered on the separate printed-circuit boards 6A and 6B, respectively, and they are then mounted in a three-dimentional manner on the upper and lower surfaces of a wiring board 2 formed with branch conductive paths by the arrangement of a busbar. As a result, the wiring harnes system is made more compact and smaller as compared with the conventional construction in which functional component groups are formed into separate groups for the respective unit electric equipment, mounted in various places of the vehicle body and connected to a wiring harness.

Then, the integration of the functional component groups on the plurality of printed-circuit boards by their stratified arrangement has the effect of increasing the freedom of arrangement and construction of the interconnection apparatus on the whole and making possible the selection of a compact shape.

Further, by virtue of the fact that the working element groups of high frequencies of replacement are arranged, along with the other replacement components such as fuses, on the upper surface of the interconnection apparatus and the control element groups having very long replacement periods are accommodated on the lower surface of the interconnection apparatus, there is the effect of considerably facilitating the maintenance of these element groups are preventing loss of the useful control elements due to their being replaced and discarded by following the replacement of the working elements.

Further, since the above-mentioned connection mechanisms utilizing the connector 17 as the common connector allows the direct connection of a part of the functional component circuits of the printed-circuit board 6B to the wiring harness without by way of the busbar 4, the arrangement of the busbar 4 on the wiring board 2 is simplified and also the single connector allows both the connection of the branch circuits of the busbar 4 and the connection and incorporation of the functional component circuits thereby decreasing the number of the connectors in the interconnection apparatus and making the interconnection apparatus more compact and smaller in size. Still further, since the connecting operation is effected collectively as compared with the conventional means of connecting the terminals of the printed-circuit board 6B to the tab contact members 5 at the ends of the busbar 4, there is the advantage of simplifying the connecting operation and reducing the danger of occurrence of malfunctions such as contact failure.

It is to be noted that the above-mentioned connecting mechanisms are applicable not only to the stratified arrangement of the functional components in the above-described embodiment but also to an interconnection apparatus employing printed-circuit boards each incorporating both control and functional element groups and it is possible to enjoy the previously mentioned effects.

From the foregoing description it will be seen that the present invention provides an interconnection apparatus which meets the need for a more compact wiring harness as required by the sophiscation of automobiles.

What is claimed is:

1. An apparatus for interconnecting branch circuit means of a wiring harness and functional component circuit means comprising a wiring board including an insulated board carrying a busbar forming branch conductive path means and printed-circuit board means mounted on said wiring board and including a plurality of functional components forming said functional component circuit means, said busbar of said wiring board including a plurality of tab contact means at end portions thereof extending perpendicularly to said insulating board, and said printed-circuit board means including a plurality of flat sheet terminals disposed in side by side relation folded around one edge of said printed-circuit board means and connected electrically by a detachable connection to said certain ones of said tab contact means upon insertion of said printed-circuit board means onto said wiring board and a plurality of tab terminals located on and carried by said printed-circuit board and extending parallel to and juxtaposed to other ones of said tab contact means, said tab terminals and said other ones of said tab contact means being arranged to simultaneously receive respective contacts of a multiple contact connector block connecting said tab terminals and said other ones of said tab contact means to respective of said branch circuit means.

2. An apparatus according to claim 1, wherein said printed-circuit board means includes a first printed-circuit board including a plurality of control element components and mounted on one surface of said wiring board and a second printed-circuit board including a plurality of functional element components and mounted on the other surface of said wiring board.

3. An apparatus according to claim 1, wherein said other ones of said tab contact means and said tab terminals are connected in common to said branch circuit means of said wiring harness through the respective contacts of said multiple contact connector block.

4. An apparatus according to claim 1, where at least some of the tab terminals of the printed circuit board means are disposed in side-by-side relationship with at least some of the tab contact means of the wiring board.

5. An apparatus according to claim 1, wherein the printed-circuit board is slidably supported for detachable mounting on the wiring board.

6. An apparatus according to claim 1, further including a cover affixed to the wiring board and enclosing at least in part the printed-circuit board, at least some of the tab contact means extend through openings in the cover for attachment to the wiring harness.

7. An apparatus according to claim 3, where said other ones of said tab contact means and said tab terminals are adjacent to each other.

8. An apparatus for interconnecting branch circuit means of a wiring harness and functional component circuit means comprising a wiring board including an insulated board carrying a busbar forming branch conductive path means and printed-circuit board means mounted on said wiring board and including a plurality of functional components forming said functional component circuit means, said busbar of said wiring board including a plurality of tab contact means at end portions thereof, and said printed-circuit board means including a plurality of flat sheet terminals at one edge of said printed-circuit board means connected to certain ones of said tab contact means, said printed-circuit board having a plurality of tab terminals extending parallel to and juxtaposed to said other ones of said tab contact means and connected along with said other ones of said tab contact means to said branch circuit means, a cover affixed to said wiring board and enclosing at least in part said printed-circuit board, at least some of said tab contact means extending through openings in said cover for attachment to the wiring harness, said cover having a peripheral flange for affording a detachable connection to the wiring board and the at least some tab contact means extending through openings in the flange.

9. An apparatus for interconnecting branch circuit means of a wiring harness and functional component circuit means comprising a wiring board including a busbar forming branch conductive path means and printed-circuit board means mounted on said wiring board and including a plurality of functional components forming said functional component circuit means, said busbar of said wiring board including tab contact means at end portions thereof, said printed-circuit board means including terminals connected to at least certain of said tab contact means, and a cover detachably affixed by means of a flange portion to the wiring board and enclosing at least in part the printed-circuit board means, at least some of the tab contact means extending through apertures in said cover flange portion for attachment to an associated connector.

10. An apparatus according to claim 9, where the printed-circuit board means includes at least one tab terminal extending through an aperture in the cover for attachment to the associated connector.

* * * * *

UNITED STATES PATENT AND TRADEMARK OFFICE
CERTIFICATE OF CORRECTION

PATENT NO. : 4,685,753

DATED : August 11, 1987

INVENTOR(S) : Isao Isshiki and Hitoshi Hayashi

It is certified that error appears in the above-identified patent and that said Letters Patent is hereby corrected as shown below:

On Title Page under "Assignee" after "Tokai Electric Wire Company Limited"

insert --and --Sumitomo Wiring Systems, Ltd.--.

Signed and Sealed this

Fifteenth Day of December, 1992

Attest:

DOUGLAS B. COMER

*Attesting Officer*      Acting Commissioner of Patents and Trademarks

UNITED STATES PATENT AND TRADEMARK OFFICE
CERTIFICATE OF CORRECTION

PATENT NO. : 4,685,753
DATED : August 11, 1987
INVENTOR(S) : Isao Isshiki and Hitoshi Hayashi It is certified that error appears in the above-identified patent and that said Letters Patent is hereby corrected as shown below:

On Title Page under "Assignee" after "Tokai Electric Wire Company Limited" insert --and Sumitomo Electric Industries, Ltd--

This certificate supersedes Certificate of Correction issued December 15, 1992.

Signed and Sealed this

Fifth Day of January, 1993

*Attest:*

DOUGLAS B. COMER

*Attesting Officer*      *Acting Commissioner of Patents and Trademarks*